US012757704B2

(12) United States Patent
Li et al.

(10) Patent No.: US 12,757,704 B2
(45) Date of Patent: Oct. 6, 2026

(54) ALIGNMENT MARK FOR BACK SIDE POWER CONNECTIONS

(71) Applicant: INTERNATIONAL BUSINESS MACHINES CORPORATION, Armonk, NY (US)

(72) Inventors: Tao Li, Slingerlands, NY (US); Ruilong Xie, Niskayuna, NY (US); Chih-Chao Yang, Glenmont, NY (US); David Wolpert, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 586 days.

(21) Appl. No.: 17/902,428

(22) Filed: Sep. 2, 2022

(65) Prior Publication Data

US 2024/0079294 A1 Mar. 7, 2024

(51) Int. Cl.

| | |
|---|---|
| ***H10W 20/20*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC .......... *H10W 20/20* (2026.01); *H10D 30/014* (2025.01); *H10D 30/43* (2025.01); *H10D 30/6729* (2025.01); *H10D 30/6757* (2025.01); *H10D 62/121* (2025.01);

(Continued)

(58) Field of Classification Search

CPC ............... H01L 23/481; H01L 23/5286; H01L 21/76897; H10D 30/014; H10D 30/43; H10D 30/6729; H10D 62/121; H10D 84/0128; H10D 84/013; H10D 84/0149;

(Continued)

(56) References Cited

U.S. PATENT DOCUMENTS 6,583,030 B1 6/2003 Grassi
7,808,111 B2 * 10/2010 Trezza .............. H01L 21/76898 257/621

(Continued)

FOREIGN PATENT DOCUMENTS

CN 103779266 A 5/2014

*Primary Examiner* — William B Partridge
*Assistant Examiner* — David Paul Sedorook
(74) *Attorney, Agent, or Firm* — Harrity & Harrity, LLP

(57) ABSTRACT

A semiconductor device is provided. The semiconductor device includes a first source/drain of a first semiconductor device, and a second source/drain of a second semiconductor device. The semiconductor device further includes a source/drain contact adjoining a first side of the first source/drain, a frontside via adjoining the source/drain contact, and a backside electric contact adjoining a first side of the second source/drain, wherein the backside electric contact is on a side opposite the source/drain contact, and a conductive alignment region. The device further includes a backside interconnect electrically connected to the conductive alignment region, wherein the backside interconnect is on the same side of the first and second source/drain as the backside electric contact, and an alignment region via electrically connected to the conductive alignment region, wherein the alignment region via is on the same side of the first and second source/drain as the source/drain contact and frontside via.

20 Claims, 8 Drawing Sheets

(51) Int. Cl.
*H10D 84/01* (2026.01)
*H10D 84/03* (2025.01)

(52) U.S. Cl.
CPC ....... *H10D 84/0128* (2025.01); *H10D 84/013* (2025.01); *H10D 84/0149* (2025.01); *H10D 84/038* (2025.01)

(58) Field of Classification Search
CPC ... H10D 84/038; H10D 30/6735; H10D 84/83
See application file for complete search history.

(56) References Cited

U.S. PATENT DOCUMENTS

| | | | | |
|---|---|---|---|---|
| 7,998,860 | B2 | 8/2011 | Li | |
| 8,158,456 | B2 | 4/2012 | Chen | |
| 9,281,335 | B2 | 3/2016 | Testa | |
| 9,543,229 | B2 | 1/2017 | Batra | |
| 11,037,885 | B2 | 6/2021 | Chien | |
| 2009/0059656 | A1* | 3/2009 | Kanakasabapathy .. | H10N 50/01 365/158 |
| 2010/0264551 | A1 | 10/2010 | Farooq | |
| 2019/0198627 | A1* | 6/2019 | Then .................... | H10D 64/256 |
| 2021/0098636 | A1 | 4/2021 | Tai | |
| 2021/0305381 | A1 | 9/2021 | Chiang | |
| 2021/0305428 | A1 | 9/2021 | Ju | |
| 2021/0320122 | A1* | 10/2021 | Zhang .................... | H10B 41/35 |
| 2022/0344463 | A1* | 10/2022 | Jung .................... | H10D 30/014 |
| 2022/0367462 | A1* | 11/2022 | Chiang ............... | H01L 23/5286 |
| 2022/0384311 | A1* | 12/2022 | Oh ...................... | H10W 20/023 |
| 2023/0343699 | A1* | 10/2023 | Lu .......................... | H10D 30/43 |

* cited by examiner

ALIGNMENT MARK FOR BACK SIDE POWER CONNECTIONS

BACKGROUND

The present invention generally relates to back-side alignment marks, and more particularly to alignment marks for source/drain and power line alignment.

A power delivery network can provide power and a reference voltage to active devices. The power delivery/distribution network (PDN) can be moved from the front side to the backside of the semiconductor wafer. Power connections can be formed to the devices on the semiconductor chips from the backside of the device substrate.

SUMMARY

In accordance with an embodiment of the present invention, a semiconductor device is provided. The semiconductor device includes a first source/drain of a first semiconductor device, and a second source/drain of a second semiconductor device. The semiconductor device further includes a source/drain contact adjoining a first side of the first source/drain, and a frontside via adjoining the source/drain contact. The semiconductor device further includes a backside electric contact adjoining a first side of the second source/drain, wherein the backside electric contact is on a side opposite the source/drain contact, and a conductive alignment region. The semiconductor device further includes a backside interconnect electrically connected to the conductive alignment region, wherein the backside interconnect is on the same side of the first source/drain and the second source/drain as the backside electric contact, and an alignment region via electrically connected to the conductive alignment region, wherein the alignment region via is on the same side of the first source/drain and the second source/drain as the source/drain contact and frontside via.

In accordance with another embodiment of the present invention, a semiconductor device is provided. The semiconductor device includes a dielectric cover layer on an interlayer dielectric (ILD) layer, and an isolation region on the dielectric cover layer. The semiconductor device further includes a backside ILD layer on the isolation region, and an alignment region via in the interlayer dielectric (ILD) layer. The semiconductor device further includes a conductive alignment region in the dielectric cover layer, isolation region, and the backside ILD layer, wherein the conductive alignment region is on and in electrical contact with the alignment region via. The semiconductor device further includes a metallization dielectric layer on the backside ILD layer, and a backside interconnect in the metallization dielectric layer, wherein the backside interconnect is on and in electrical contact with the conductive alignment region.

In accordance with yet another embodiment of the present invention, a method of fabricating a semiconductor device is provided. The method includes forming a plurality of semiconductor devices on a substrate, wherein each of the plurality of semiconductor devices includes a source/drain on a sacrificial plug, and forming a source/drain contact to at least a first source/drain of the plurality of source/drains. The method further includes forming a conductive alignment region on the substrate, and inverting the substrate, plurality of semiconductor devices, and the conductive alignment region. The method further includes removing the substrate to expose at least a portion of the conductive alignment region and the sacrificial plugs, and forming a backside electric contact to at least a second source/drain of the plurality of source/drains, wherein the backside electric contact is on a side of the second source/drain opposite from the source/drain contact. The method further includes forming a backside interconnect on and in electrical contact with the conductive alignment region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate to forming an alignment mark for direct backside source/drain connections to a backside power delivery (or distribution) network (BSPDN).

In various embodiments, a shallow through silicon via (TSV) formed during middle-of-line (MOL) processing can be used for the alignment of two bonding wafers when connecting several bonded wafers together.

Embodiments of the present invention relate to forming an alignment via at the front-end-of-line (FEOL) or MOL processing with a part of the via through the substrate, which can be revealed during extreme wafer backside thinning for easy backside CA patterning.

Exemplary applications/uses to which the present invention can be applied include, but are not limited to: devices using a BSPND process with direct backside contacts, for example, logic and memory devices.

It is to be understood that aspects of the present invention will be described in terms of a given illustrative architecture; however, other architectures, structures, substrate materials and process features and steps can be varied within the scope of aspects of the present invention.

Figure 1:
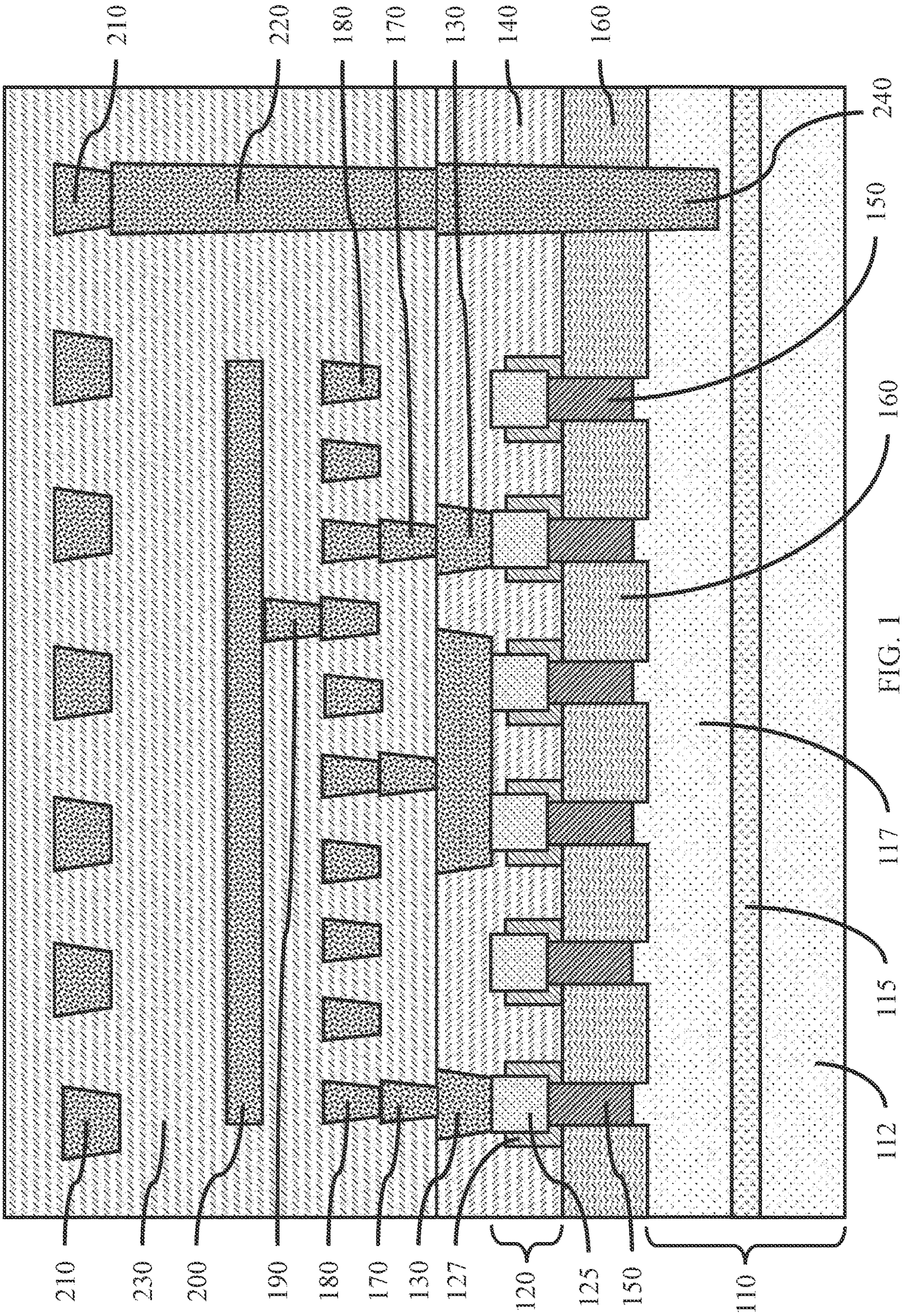
FIG. 1 is a cross-sectional side view showing electronic devices, a metallization layer, via interconnects, and an alignment feature, in accordance with an embodiment of the present invention.

Referring now to the drawings in which like numerals represent the same or similar elements and initially to FIG. 1, FIG. 1 is a cross-sectional side view showing electronic devices, a metallization layer, via interconnects, and an alignment feature, in accordance with an embodiment of the present invention.

In one or more embodiments, a plurality of semiconductor devices 120 can be disposed on a substrate 110, where the substrate 110 can include a support layer 112, an etch-stop layer 115, and an active semiconductor layer 117. The plurality of semiconductor devices 120 can be formed from/on the active semiconductor layer 117. In various embodiments, the etch-stop layer 115 can be a buried oxide layer (BOX) of a semiconductor-on-insulator (SeOI) substrate 110.

In various embodiments, the semiconductor devices 120 can be, for example, nanosheet field effect transistor (NS-FET) devices or fin field effect transistor (FinFET) devices, having a source/drain 125 adjoining one or more fins or nanosheets. A source/drain contact 130 can be in electrical contact with the source/drain 125, where the source/drain contact 130 can include electrically conductive materials, for example, tungsten (W), copper (Cu), tantalum (Ta), molybdenum (Mo), nickel (Ni), cobalt (Co), and combinations thereof. The source/drain 125 can be an n-doped or p-doped semiconductor material. A dielectric sidewall layer 127 can be on opposite sides and beneath at least a portion of the source/drain 125. A dielectric cover layer 140 can be over the semiconductor devices 120, source/drains 125, and source/drain contact 130.

In one or more embodiments, a sacrificial plug 150 can be beneath the source/drain 125, where the sacrificial plug 150 can be adjoining a surface of the source/drain 125 opposite the source/drain contact 130. In various embodiments, isolation regions 160 can be on opposite sides of the sacrificial plug 150, where the isolation regions 160 can separate adjacent pairs of sacrificial plugs 150 and electrically separate the semiconductor devices 120 from the active semiconductor layer 117. The isolation regions 160 can be an electrically insulating, dielectric material, for example, silicon oxide ($SiO_x$).

In one or more embodiments, a conductive alignment region 240 can be formed through the dielectric cover layer 140, isolation regions 160, and into the active semiconductor layer 117, where the bottom of the conductive alignment region 240 can be separated from the etch-stop layer 115 by a portion of the active semiconductor layer 117.

In one or more embodiments, back-end-of-line (BEOL) electrical connections, including lower vias 170, lower conductive lines 180, intermediate vias 190, intermediate conductive lines 200, upper conductive lines 210, and alignment region vias 220, formed in an interlayer dielectric (ILD) layer 230, can be formed on the dielectric cover layer 140 and semiconductor devices 120. The lower vias 170 can form electrical connections to the source/drain contacts 130, and the alignment region vias 220 can form an electrical connection to the conductive alignment region 240. The ILD layer 230 can be on the dielectric cover layer 140, and electrically insulate the lower vias 170, lower conductive lines 180, intermediate vias 190, intermediate conductive lines 200, upper conductive lines 210, and alignment region vias 220.

In various embodiments, the ILD layer 230 can be, for example, silicon oxide ($SiO_x$).

In various embodiments, the lower vias 170, lower conductive lines 180, intermediate vias 190, intermediate conductive lines 200, upper conductive lines 210, and alignment region vias 220 can be a conductive material, including, but not limited to, tungsten (W), copper (Cu), tantalum (Ta), molybdenum (Mo), nickel (Ni), cobalt (Co), and combinations thereof.

Figure 2:
FIG. 2 is a cross-sectional side view showing electronic devices, a metallization layer, via interconnects, and an alignment feature after the wafer flip, in accordance with an embodiment of the present invention.

FIG. 2 is a cross-sectional side view showing electronic devices, a metallization layer, via interconnects, and an alignment feature after the wafer flip, in accordance with an embodiment of the present invention.

In one or more embodiments, the substrate 110, dielectric cover layer 140, ILD layer 230, and associated metallization layers, can be flipped 180 degrees (i.e., inverted), such that the semiconductor devices 120 and electrical contacts are flip upside down, and the bottom surface of the support layer 112 becomes the top working surface.

Figure 3:
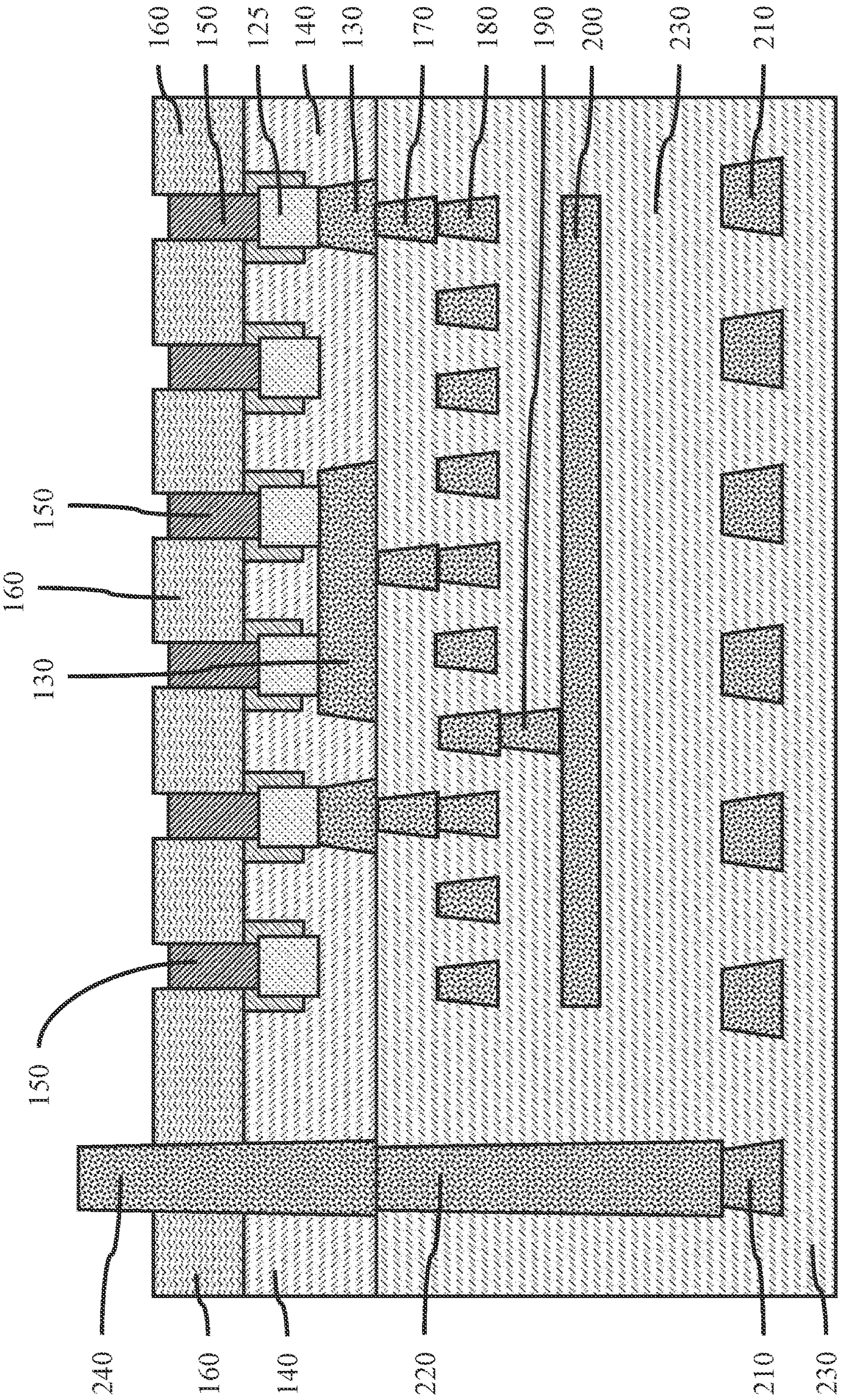
FIG. 3 is a cross-sectional side view showing the alignment feature protruding above the bask-side surface after removal of the substrate, in accordance with an embodiment of the present invention.

FIG. 3 is a cross-sectional side view showing the alignment feature protruding above the bask-side surface after removal of the substrate, in accordance with an embodiment of the present invention.

In one or more embodiments, the support layer 112 of the substrate 110 can be removed, for example, using chemical-mechanical polishing (CMP) and/or etching (e.g., reactive ion etching (RIE), wet chemical etching), to expose the etch-stop layer 115 in the substrate 110. In various embodiments, the etch-stop layer 115 can be subsequently removed using CMP and/or a selective etch (e.g., wet chemical etch) to expose the underlying active semiconductor layer 117 of the substrate 110. Removal of at least portions of the active semiconductor layer 117 can expose surfaces of the sacrificial plug(s) 150, isolation region(s) 160, and a portion of the conductive alignment region 240, where a portion of the conductive alignment region 240 can project above the surface(s) of the isolation region(s) 160 that were adjoining the active semiconductor layer 117. The surfaces of the sacrificial plug(s) 150 can be below the surfaces of the isolation region(s) 160 after removing the active semiconductor layer 117.

Figure 4:
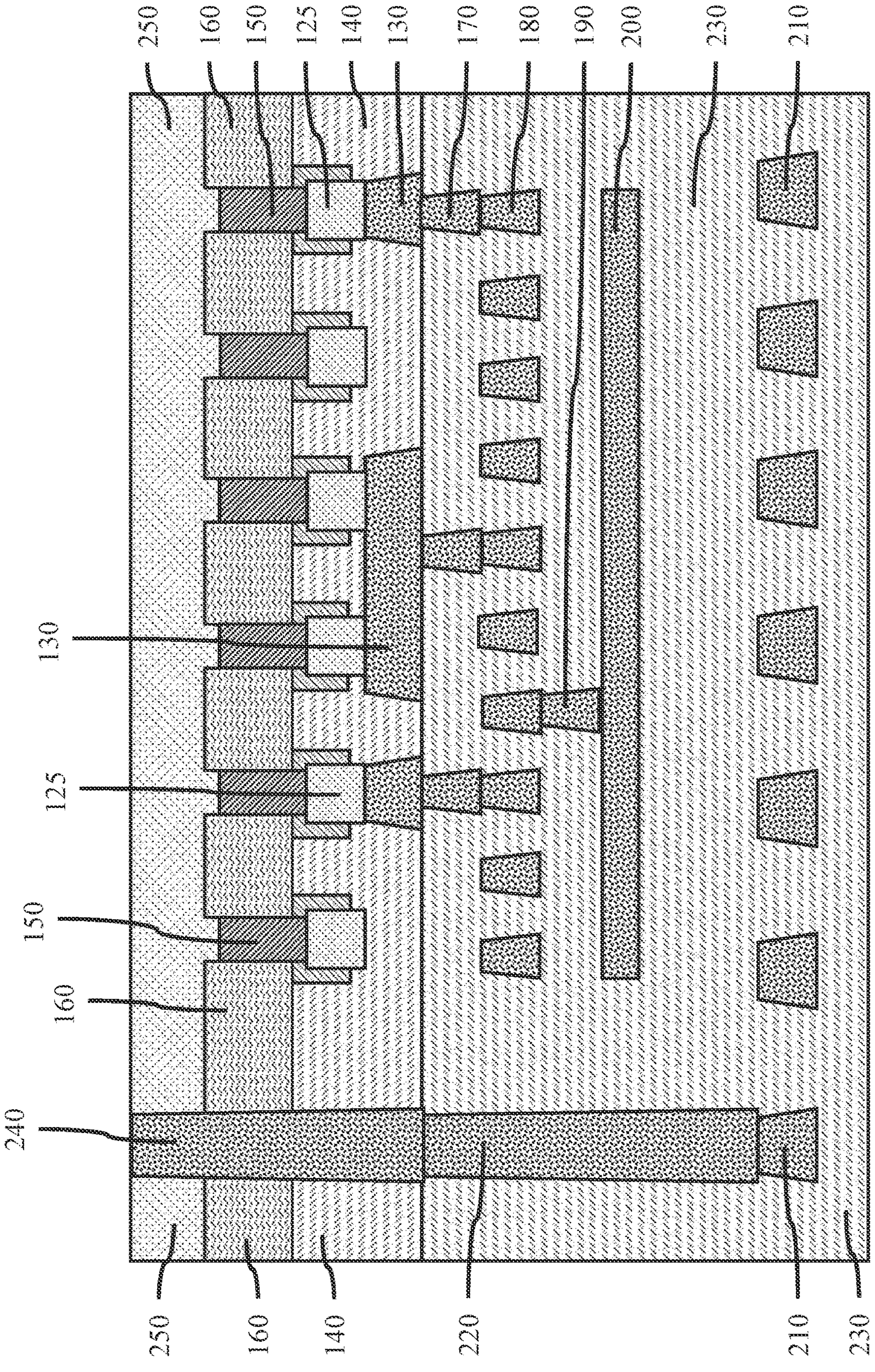
FIG. 4 is a cross-sectional side view showing a back-side interlayer dielectric (ILD) layer on the alignment feature and the bask-side surface, in accordance with an embodiment of the present invention.

FIG. 4 is a cross-sectional side view showing a back-side interlayer dielectric (ILD) layer on the alignment feature and the bask-side surface, in accordance with an embodiment of the present invention.

In one or more embodiments, a backside ILD layer 250 can be formed on the exposed surfaces of the sacrificial plug(s) 150, isolation region(s) 160, and projecting portion of the conductive alignment region 240, where the backside ILD layer 250 can be formed by a blanket deposition (e.g., CVD), and partially etched back, for example, using CMP and/or selective etching to expose the conductive alignment region 240. The backside ILD layer 250 can fill in the space between the top surface of the sacrificial plug(s) 150 and the top surface of the isolation region(s) 160.

In various embodiments, the backside ILD layer 250 can be an electrically insulating dielectric material, for example, silicon oxide ($SiO_x$).

The conductive alignment region 240 can act as an alignment mark on the backside of the semiconductor device layer, including the semiconductor devices 120 and source/drain contact(s) 130 in the dielectric cover layer 140. The use of the exposed conductive alignment region 240 acting as a prefabricated alignment via to improve a subsequent back side contact (BSCA) opening alignment. During backside patterning the top surface of the conductive alignment region 240 can be used as the alignment mark for positioning the one or more openings 255 relative to the sacrificial plug(s) 150.

In various embodiments, the conductive alignment region 240 can have a diameter in a range of about 500 nanometers (nm) to 1000 nm, or about 1000 nm to about 1500 nm, although other diameters are also contemplated.

In various embodiments, the conductive alignment region 240 can extend about 20 nanometers (nm) to about 100 nm, or about 30 nm to about 50 nm, above the top surface of the adjacent isolation region 160, although other heights are also contemplated.

In various embodiments, the alignment mark can also serve as one of the power lines between BSPND and BEOL.

Figure 5:
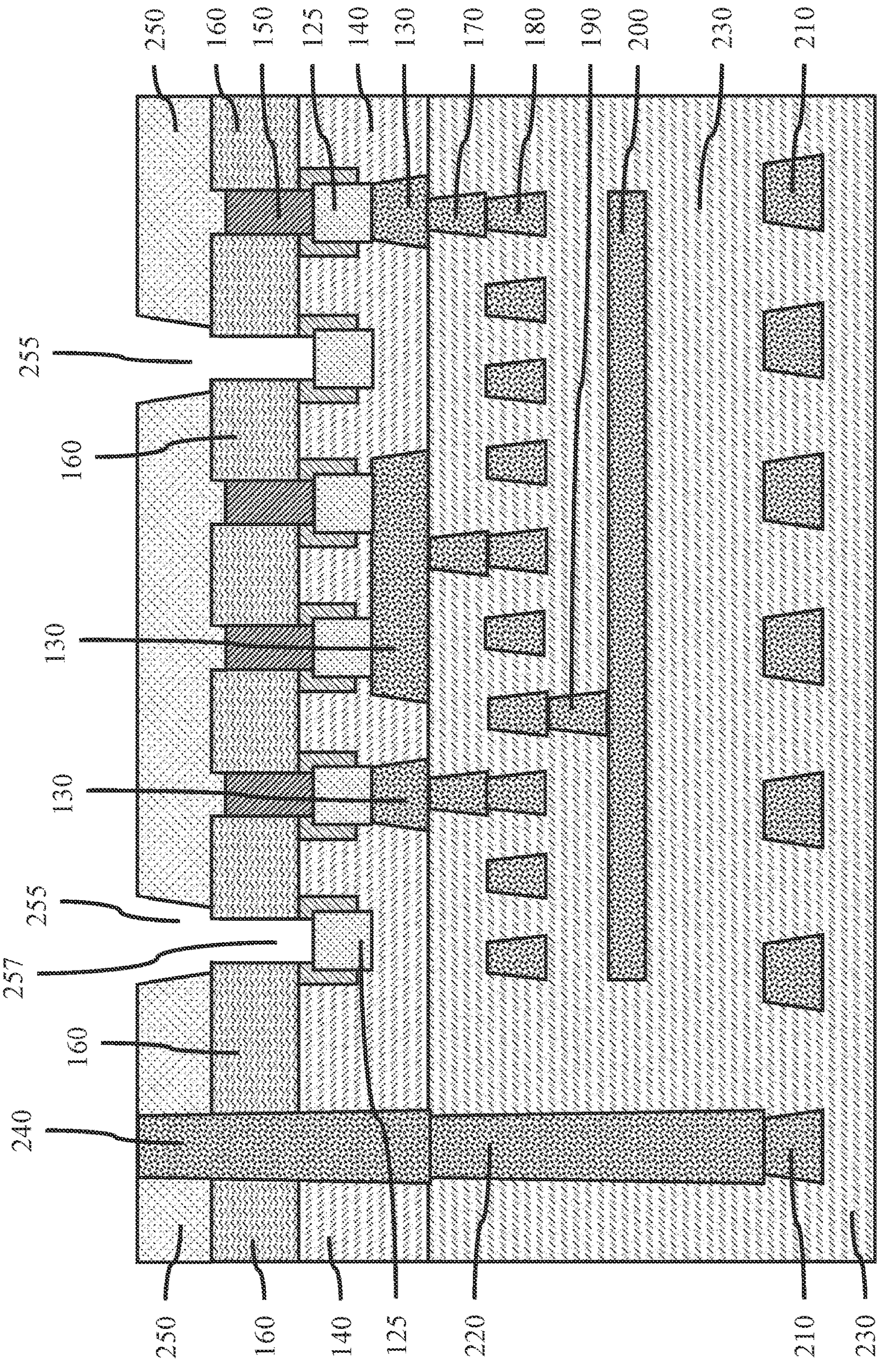
FIG. 5 is a cross-sectional side view showing back-side contact patterning in the back-side ILD layer for electrical contacts to the devices, in accordance with an embodiment of the present invention.

FIG. 5 is a cross-sectional side view showing back-side contact patterning in the back-side ILD layer for electrical contacts to the devices, in accordance with an embodiment of the present invention.

In one or more embodiments, one or more openings 255 can be formed in the backside ILD layer 250 using masking, lithography, and etching. The openings can be aligned with predetermined sacrificial plug(s) 150, where forming the one or more openings 255 exposes a top surface of the intended sacrificial plug(s) 150. In various embodiments, the openings 255 can be larger than the surface of the sacrificial plug(s) 150, such that a portion of the isolation region 160 may be exposed. In various embodiments, the exposed sacrificial plug(s) 150 can be removed from between the isolation region(s) 160 using a selective etch, where removal of the isolation region 160 can form a trench 257 between the isolation region(s) 160 that exposes the underlying source/drain 125. The sacrificial plug(s) 150 can be removed using a selective etch.

Figure 6:
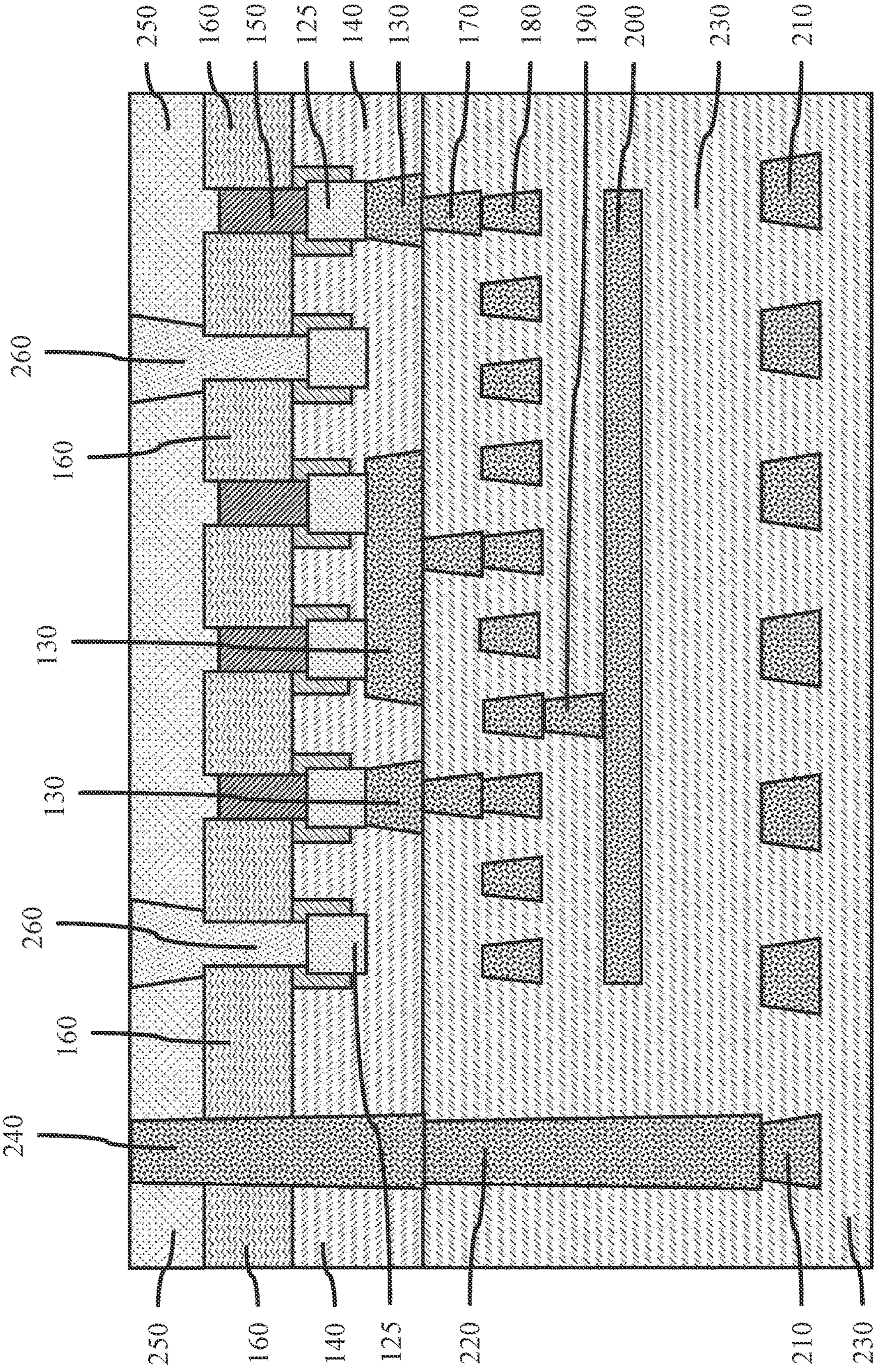
FIG. 6 is a cross-sectional side view showing formation of electrical contacts through the backside ILD layer to the source/drain(s), in accordance with an embodiment of the present invention.

FIG. 6 is a cross-sectional side view showing formation of electrical contacts through the backside ILD layer to the source/drain(s), in accordance with an embodiment of the present invention.

In one or more embodiments, a conductive fill can be formed in the openings 255 and trenches 257 to form backside electric contacts 260 to the source/drain(s) 125. The source/drain(s) 125 will either get contacted by source/drain contact 130 (for a signal mostly) or backside electric contact 260 (for power). The source/drain(s) 125 will not be in contact with both a source/drain contact 130 and a backside electric contacts 260.

In various embodiments, the conductive fill and backside electric contacts 260 can be a conductive metal, including, but not limited to, tungsten (W), copper (Cu), tantalum (Ta), molybdenum (Mo), nickel (Ni), cobalt (Co), and combinations thereof.

Figure 7:
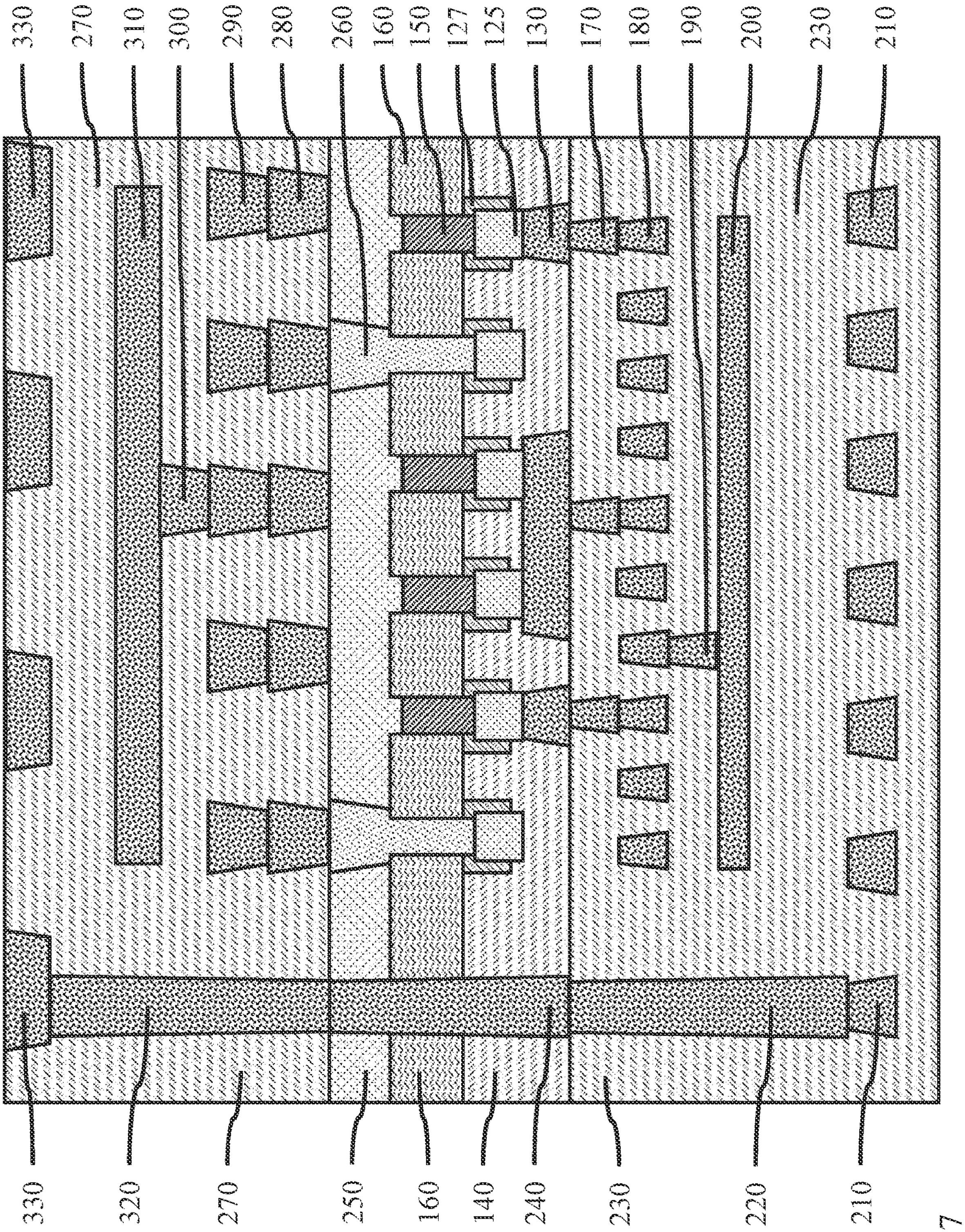
FIG. 7 is a cross-sectional side view showing back-side metallization layers and vias to the back-side contact patterning, in accordance with an embodiment of the present invention.

FIG. 7 is a cross-sectional side view showing back-side metallization layers and vias to the backside electric contacts, in accordance with an embodiment of the present invention.

In one or more embodiments, back-side metallization layers and vias can be formed to the backside electric contacts 260. In various embodiments, a metallization dielectric layer 270 can be formed on the backside ILD layer 250 and backside electric contacts 260 by a blanket deposition (e.g., CVD), where the metallization dielectric layer 270 can cover the conductive alignment region 240 and backside electric contacts 260.

In one or more embodiments, metallization layer vias 280 and metallization layer lines 290 can be formed in the metallization dielectric layer 270 on the backside of the devices 120. In various embodiments, upper level vias 300 and upper level metal lines 310, 330 can be formed in the metallization dielectric layer 270. Metal lines between M1 and Mx have been omitted from the figures for the sake of simplicity.

In one or more embodiments, a backside interconnect 320 can be formed in the metallization dielectric layer 270, where the backside interconnect 320 is electrically connected to the conductive alignment region 240 and an upper level metal line 330 that can supply a voltage or input/output signal to the backside interconnect 320.

Figure 8:
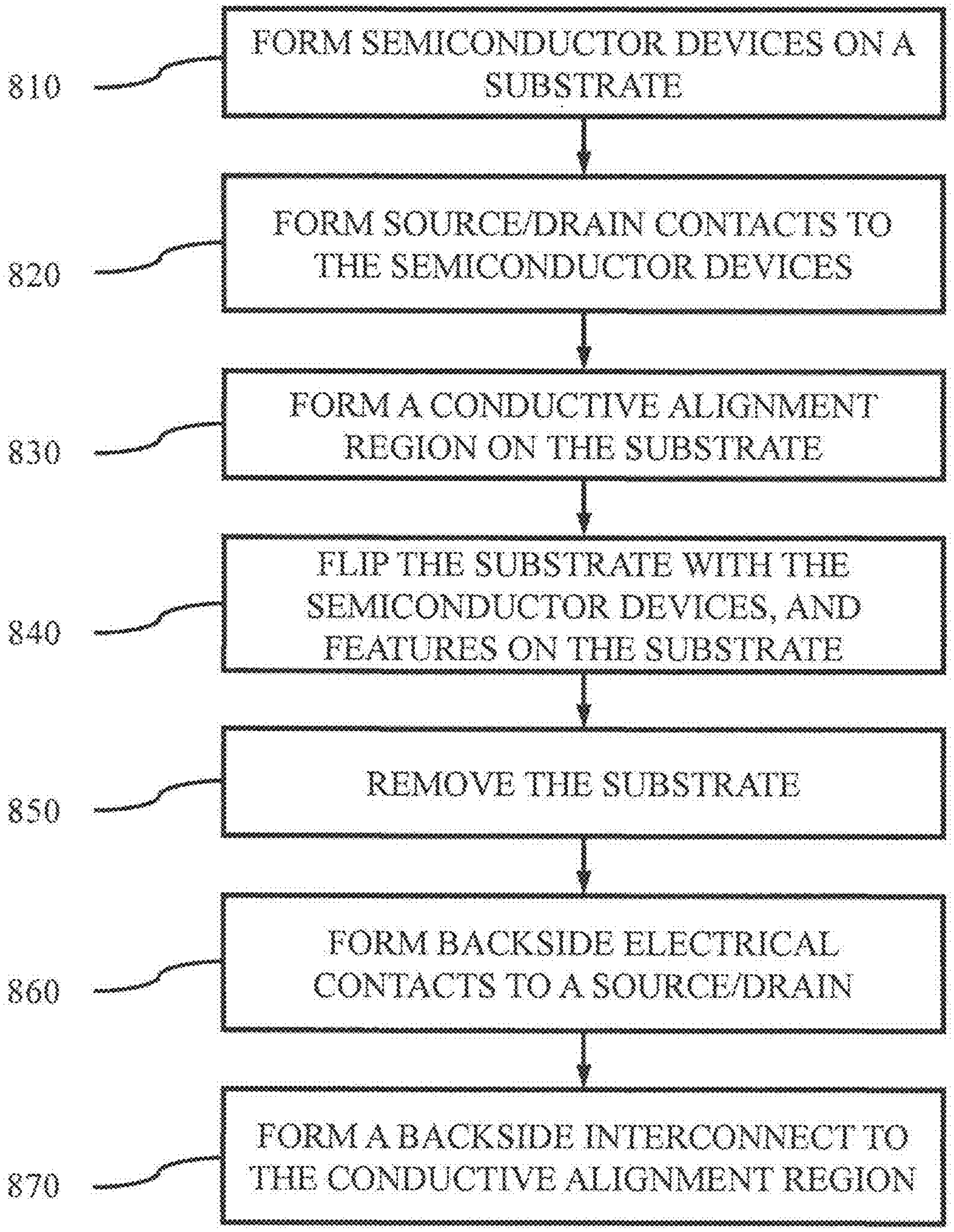
FIG. 8 is a block/flow chart of a fabrication process for the alignment mark for back side power connections, in accordance with an embodiment of the present invention.

FIG. 8 is a block/flow chart of a fabrication process for the alignment mark for back side power connections, in accordance with an embodiment of the present invention.

At block 810, semiconductor devices can be formed on a substrate, where the substrate can be a silicon-on-insulator (SOI) substrate. The semiconductor devices can be nanosheet field effect transistor devices and/or fin field effect transistor devices, where the semiconductor devices can be previously fabricated on the substrate.

At block 820, source/drain contacts can be formed to one or more of the source/drains forming the semiconductor devices. The source/drain contacts can be metallic contacts configured to provide electricity to the semiconductor devices.

At block 830, a conductive alignment region can be formed on the substrate, where the conductive alignment region could be formed prior to or subsequent to the semiconductor devices.

At block 840, the substrate along with the semiconductor devices, conductive alignment region, and other features previously formed on the substrate can be flipped, so the bottom of the substrate becomes a top surface, and the semiconductor devices and other features become inverted.

At block 850, the substrate can be removed to expose portions of the conductive alignment region and other features.

At block 860, backside electrical contacts can be formed to at least some of the source/drains, where the electrical contacts may be formed to source/drains that are not electrically connected to source/drain contacts.

At block 870, a backside interconnect can be formed to the conductive alignment region, where the backside interconnect can provide power and a reference voltage to the semiconductor devices.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:

a first source/drain of a first semiconductor device;

a second source/drain of a second semiconductor device;

a source/drain contact adjoining a first side of the first source/drain;

a frontside via adjoining the source/drain contact;

a backside electric contact disposed in a contact opening and adjoining a first side of the second source/drain, wherein the backside electric contact is on a side opposite the source/drain contact;

a conductive alignment region having a vertical length that extends from a frontside interconnect side to a backside interconnect side opposite the frontside interconnect side, the conductive alignment region including a terminal surface facing the backside interconnect side, wherein the terminal surface defines an alignment mark for positioning the contact opening;

a backside interconnect electrically connected to the conductive alignment region, wherein the backside interconnect is located on the backside interconnect side and on a same side of the first source/drain and the second source/drain as the backside electric contact;

an alignment region via electrically connected to the conductive alignment region, wherein the alignment region via is located on the frontside interconnect side and on a same side of the first source/drain and the second source/drain as the source/drain contact and the frontside via; and wherein the conductive alignment region, the backside interconnect, and the alignment region via are separate and distinct from one another, and wherein a width of the conductive alignment region at the terminal surface is greater than a width of the alignment region via.

2. The semiconductor device of claim 1, further comprising a sacrificial plug adjoining the first source/drain of the first semiconductor device, wherein the sacrificial plug is on an opposite side of the first source/drain from the source/drain contact.

3. The semiconductor device of claim 2, further comprising a lower conductive line electrically connected to the frontside via, and a metallization layer via electrically connected to the backside electric contact.

4. The semiconductor device of claim 3, further comprising an upper level metal line electrically connected to the backside interconnect, wherein the upper level metal line is configured to provide a voltage to the backside interconnect.

5. The semiconductor device of claim 4, further comprising a plurality of isolation regions, a backside interlayer dielectric layer on the plurality of isolation regions, and a metallization dielectric layer on the backside interlayer dielectric layer, wherein the backside electric contact is in the backside interlayer dielectric layer, and the backside interconnect is in the metallization dielectric layer.

6. The semiconductor device of claim 5, further comprising a plurality of metallization layer vias and a plurality of metallization layer lines in the metallization dielectric layer, wherein one of the plurality of metallization layer vias is on and in electrical contact with the backside electric contact.

7. The semiconductor device of claim 6, wherein the first semiconductor device and the second semiconductor device are nanosheet transistor devices.

8. The semiconductor device of claim 7, further comprising a dielectric cover layer on the first semiconductor device and the second semiconductor device, wherein the source/drain contact is in the dielectric cover layer, and wherein the conductive alignment region extends through the dielectric cover layer.

9. The semiconductor device of claim 8, wherein the plurality of isolation regions includes isolation regions that are on opposite sides of the sacrificial plug and on opposite sides of the conductive alignment region.

10. A semiconductor device, comprising:

a dielectric cover layer on an interlayer dielectric layer;

an isolation region on the dielectric cover layer;

a backside interlayer dielectric layer on the isolation region;

an alignment region via in the interlayer dielectric layer;

a conductive alignment region in the dielectric cover layer, the isolation region, and the backside interlayer dielectric layer, the conductive alignment region having a vertical length that extends from a frontside interconnect side to a backside interconnect side opposite the frontside interconnect side, wherein the conductive alignment region is on and in electrical contact with the alignment region via, the conductive alignment region including a terminal surface facing the backside interconnect side, wherein the terminal surface defines an alignment mark for positioning one or more contact openings in the backside interlayer dielectric layer;

a metallization dielectric layer on the backside interlayer dielectric layer;

a backside interconnect in the metallization dielectric layer, wherein the backside interconnect is located on the backside interconnect side and is on and in electrical contact with the conductive alignment region; and wherein the alignment region via is located on the frontside interconnect side, wherein the conductive alignment region, the backside interconnect, and the alignment region via are separate and distinct from one another, and wherein a width of the conductive alignment region at the terminal surface is greater than a width of the alignment region via.

11. The semiconductor device of claim 10, further comprising a plurality of semiconductor devices in the dielectric cover layer.

12. The semiconductor device of claim 11, further comprising a first source/drain of a first semiconductor device of the plurality of semiconductor devices, and a source/drain contact adjoining a first side of the first source/drain.

13. The semiconductor device of claim 12, further comprising a second source/drain of a second semiconductor device of the plurality of semiconductor devices, and a backside electric contact disposed in one of the one or more contact openings and adjoining a first side of the second source/drain, wherein the backside electric contact is on a side opposite the source/drain contact.

14. The semiconductor device of claim 13, further comprising a sacrificial plug adjoining the first source/drain of the first semiconductor device, wherein the sacrificial plug is on an opposite side of the first source/drain from the source/drain contact.

15. A method of fabricating a semiconductor device, comprising:

forming a plurality of semiconductor devices on a substrate, the plurality of semiconductor devices including a first semiconductor device and a second semiconductor device, each of the plurality of semiconductor devices including a source/drain on a sacrificial plug, the first semiconductor device including a first source/drain on a first sacrificial plug, and the second semiconductor device including a second source/drain on a second sacrificial plug;

forming a source/drain contact adjoining a first side of the first source/drain;

forming a frontside via adjoining the source/drain contact;

forming a conductive alignment region on the substrate, wherein the conductive alignment region has a vertical length that extends from a frontside interconnect side to a backside interconnect side opposite the frontside interconnect side;

forming an alignment region via electrically connected to the conductive alignment region, wherein the alignment region via is located on the frontside interconnect side and on a same side of the first source/drain and the second source/drain as the source/drain contact and the frontside via;

inverting the substrate, the plurality of semiconductor devices, and the conductive alignment region;

removing the substrate to expose at least a portion of the conductive alignment region, the first sacrificial plug, and the second sacrificial plug, including exposing a terminal surface of the conductive alignment region facing the backside interconnect side, and wherein a width of the conductive alignment region at the terminal surface is greater than a width of the alignment region via;

forming a contact opening, wherein the terminal surface defines an alignment mark for positioning the contact opening;

forming a backside electric contact disposed in the contact opening and adjoining a first side of the second source/drain, wherein the backside electric contact is on a side opposite the source/drain contact;

forming a backside interconnect electrically connected to the conductive alignment region, wherein the backside interconnect is located on the backside interconnect side and on a same side of the first source/drain and the second source/drain as the backside electric contact; and wherein the conductive alignment region, the backside interconnect, and the alignment region via are separate and distinct from one another.

16. The method of claim 15, wherein forming the backside electric contact includes removing the second sacrificial plug to form a trench extending from the contact opening to the second source/drain, and filling the contact opening and the trench with a conductive fill.

17. The method of claim 16, further comprising, before forming the backside interconnect, forming a metallization dielectric layer over the conductive alignment region and the backside electric contact, wherein the backside interconnect is formed in the metallization dielectric layer.

18. The method of claim 17, wherein the substrate is a semiconductor-on-insulator substrate.

19. The method of claim 18, further comprising forming a dielectric cover layer on the plurality of semiconductor devices, wherein the source/drain contact is formed in the dielectric cover layer.

20. The method of claim 19, further comprising forming an upper level metal line on and in electrical contact with the backside interconnect, wherein the upper level metal line is configured to supply a voltage to the backside interconnect.

* * * * *